(12) United States Patent
Tan et al.

(10) Patent No.: US 11,901,425 B2
(45) Date of Patent: Feb. 13, 2024

(54) NON-VOLATILE MEMORY DEVICES WITH ASYMMETRICAL FLOATING GATES

(71) Applicant: GLOBALFOUNDRIES Singapore Pte. Ltd., Singapore (SG)

(72) Inventors: Shyue Seng Tan, Singapore (SG); Xinshu Cai, Singapore (SG); Eng Huat Toh, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 17/463,475

(22) Filed: Aug. 31, 2021

(65) Prior Publication Data
US 2023/0062215 A1 Mar. 2, 2023

(51) Int. Cl.
| | |
|---|---|
| *H01L 29/423* | (2006.01) |
| *H01L 29/788* | (2006.01) |
| *H01L 29/78* | (2006.01) |
| *H01L 29/66* | (2006.01) |
| *H01L 21/28* | (2006.01) |

(52) U.S. Cl.
CPC .. *H01L 29/42324* (2013.01); *H01L 29/40114* (2019.08); *H01L 29/66492* (2013.01); *H01L 29/66825* (2013.01); *H01L 29/7835* (2013.01); *H01L 29/7885* (2013.01)

(58) Field of Classification Search
CPC ......... H01L 29/66825; H01L 29/42324; H01L 29/788
See application file for complete search history.

(56) References Cited

U.S. PATENT DOCUMENTS

| | | | |
|---|---|---|---|
| 6,137,723 A | 10/2000 | Bergemont et al. | |
| 7,099,192 B2 | 8/2006 | Wang et al. | |
| 7,800,156 B2 | 9/2010 | Roizin et al. | |
| 2010/0027347 A1* | 2/2010 | Pikhay | G11C 16/0441 257/315 |
| 2014/0312405 A1* | 10/2014 | Park | H01L 29/788 257/316 |

* cited by examiner

*Primary Examiner* — Xiaoming Liu
(74) *Attorney, Agent, or Firm* — David Cain

(57) ABSTRACT

A non-volatile memory device is provided. The non-volatile memory device includes a substrate having an active region, a source region, a drain region, and a floating gate. The source region and the drain region may be arranged in the active region, the drain region may be arranged adjacent to the source region. The source region and the drain region may define a channel region therebetween. The floating gate may be arranged over the active region, and may include a first section over the channel region, a plurality of second sections over the drain region, and a connecting section arranged between the first section and the plurality of second sections.

17 Claims, 6 Drawing Sheets

NON-VOLATILE MEMORY DEVICES WITH ASYMMETRICAL FLOATING GATES

TECHNICAL FIELD

The present disclosure relates generally to semiconductor devices, and more particularly to non-volatile memory devices having asymmetrical floating gates and methods of forming the same.

BACKGROUND

Semiconductor devices, such as logic and memory devices, may provide a wide range of applications. There is a continued demand for lighter, thinner, and smaller electronic products, resulting in a demand for lighter, thinner, and smaller semiconductor devices.

However, the physical miniaturization of semiconductor devices may bring about a decrease in device performance. For example, a smaller non-volatile memory (NVM) device may result in a lower coupling ratio between a floating gate and a control gate due to smaller feature dimensions, thereby decreasing the program and/or erase efficiency of the NVM device.

Therefore, to meet the demand for lighter, thinner, and smaller semiconductor devices without sacrificing device performance, solutions are provided to overcome, or at least ameliorate, the disadvantages described above.

SUMMARY

To achieve the foregoing and other aspects of the present disclosure, NVM devices having asymmetrical floating gates and methods of forming the same are presented.

According to another aspect of the present disclosure, a non-volatile memory device is provided. The non-volatile memory device includes a substrate having an active region, a source region, a drain region, and a floating gate. The source region and the drain region may be arranged in the active region, the drain region may be arranged adjacent to the source region. The source region and the drain region may define a channel region therebetween. The floating gate may be arranged over the active region, and may include a first section over the channel region, a plurality of second sections over the drain region, and a connecting section arranged between the first section and the plurality of second sections.

According to another aspect of the present disclosure, a non-volatile memory device is provided. The non-volatile memory device includes a substrate having an active region, a device well, a coupling well, a source region, a drain region, and a floating gate. The device well may be arranged adjacent to the coupling well. The source region may be arranged within the device well and the drain region may be arranged within the device well and the coupling well. The source region and the drain region may define a channel region therebetween in the device well. The floating gate may be arranged over the source region and the drain region, and may include a first section over the channel region, a plurality of second sections over the drain region in the coupling well, and a connecting section over the device well and between the first section and the plurality of second sections.

According to yet another aspect of the present disclosure, a method of forming a non-volatile memory device is provided. The method includes forming a source region and a drain region in an active region of a substrate and forming a floating gate over the active region. The source region and the drain region may define a channel region therebetween. The floating gate may include a first section over the channel region, a plurality of second sections over the drain region, and a connecting section between the first section and the plurality of second sections.

BRIEF DESCRIPTION OF THE DRAWINGS

The embodiments of the present disclosure will be better understood from a reading of the following detailed description, taken in conjunction with the accompanying drawings.

Figure 1A:
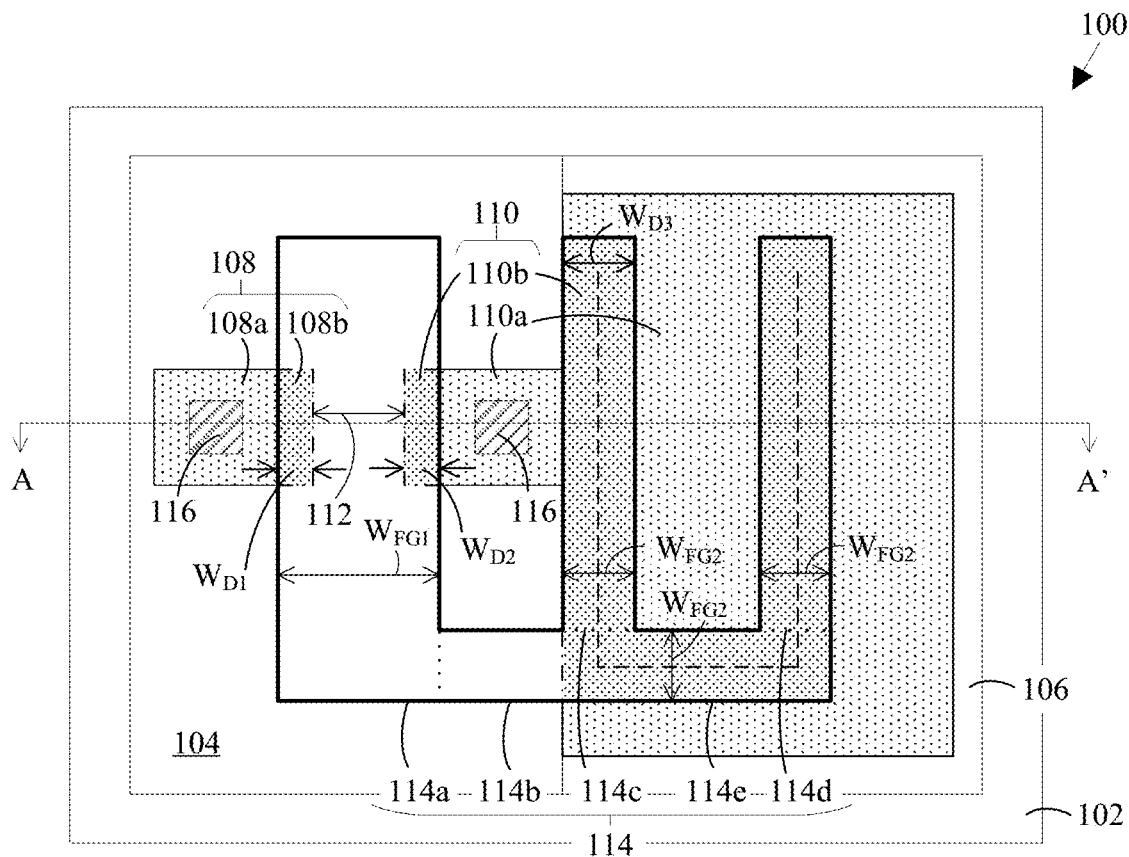
FIG. 1A is a plan view of a non-volatile memory device, according to an embodiment of the disclosure.

For simplicity and clarity of illustration, the drawings illustrate the general manner of construction, and certain descriptions and details of features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to non-volatile memory (NVM) devices with asymmetrical floating gates providing enhanced coupling ratio and methods of forming the same. The NVM device may include a memory device that utilizes a floating gate to store charges, for example, a flash memory device, an erasable programmable read-only memory (EPROM) device, or an electrically erasable and programmable read-only memory (EEPROM) device. The floating gate may be arranged over a channel region that is defined between a source region and a drain region of the memory cell.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

FIG. 1A is a plan view of an NVM device 100, according to an embodiment of the disclosure. The NVM device 100 may be arranged in a memory device region of a semiconductor device and the NVM device 100 may be part of a plurality of NVM devices arranged in an array configuration of rows and columns in the memory device region. Only one NVM device is illustrated for clarity purposes.

The NVM device 100 may be formed over a substrate (not shown). The substrate may include a semiconductor material, such as silicon, silicon germanium, silicon carbide, other II-VI or III-V semiconductor compounds, and the like. Furthermore, the substrate may be in a form of a bulk semiconductor substrate or a layered semiconductor substrate, such as a semiconductor-on-insulator (SOI) substrate. In an embodiment of the disclosure, the substrate may include P-type conductivity dopants having a substrate dopant concentration. The P-type conductivity dopants may include, but not limited to, boron, aluminum, or gallium.

The substrate may include an active region 102 over the substrate. The active region 102 may include P-type conductivity dopants having a dopant concentration lower than the substrate dopant concentration. The active region 102 may include a plurality of doped regions arranged therein. The plurality of doped regions may include a device well 104, a coupling well 106, a source region 108, and a drain region 110. The device well 104 may be arranged adjacent to the coupling well 106. The device well 104 and the coupling well 106 may include P-type conductivity dopants having different dopant concentrations, for example, the device well 104 may have a higher dopant concentration than the coupling well 106 and the active region 102. In an embodiment of the disclosure, the coupling well 106 may have a dopant concentration substantially similar to the active region dopant concentration, and the coupling well 106 may be referred to as a native well.

The source region 108 may be arranged within the device well 104. The source region 108 may include a source diffusion region 108a and a source lightly-doped diffusion (LDD) region 108b; the source diffusion region 108a being arranged adjacent to and electrically coupled to the source LDD region 108b. The source LDD region 108b may have a width $W_{D1}$.

The drain region 110 may be arranged adjacent to the source region 108. The drain region 110 may be further arranged extending within the device well 104 and the coupling well 106. The drain region 110 may include a drain diffusion region 110a and a drain LDD region 110b; the drain diffusion region 110a being arranged adjacent to and electrically coupled to the drain LDD region 110b. The drain LDD region 110b within the device well 104 may have a width $W_{D2}$. The width $W_{D2}$ may be substantially equal to the width $W_{D1}$ of the source LDD region 108b, though not necessarily so. The drain LDD region 110b within the coupling well 106 may have a width $W_{D3}$, which may be at most twice the width $W_{D2}$ of the drain LDD region 110b. The drain LDD region 110b within the device well 104 may be further arranged between the drain diffusion region 110a and the source LDD region 108b such that the drain LDD region 110b and the source LDD region 108b may define a channel region 112 therebetween.

The source region 108 and the drain region 110 may include dopants having different dopant conductivity from the device well 104, for example, N-type conductivity dopants. N-type conductivity dopants may include, but not limited to, arsenic, phosphorus, or antimony. However, the source region 108 and the drain region 110 may not necessarily include the same N-type conductivity dopants. The source diffusion region 108a may have a higher dopant concentration than the source LDD region 108b, and similarly, the drain diffusion region 110a may have a higher dopant concentration than the drain LDD region 110b.

For ease of manufacturing the NVM device 100, the source region 108 and the drain region 110 may include the same N-type conductivity dopants and similar dopant concentrations. For example, the source diffusion region 108a and the drain diffusion region 110a may have a substantially similar dopant concentration, and the source LDD region 108b and the drain LDD region 110b may have a substantially similar dopant concentration.

The NVM device 100 may further include a floating gate 114. The floating gate 114 may be arranged over the active region 102. The floating gate 114 may have a device portion over the device well 104 and a coupling portion over the coupling well 106. The device portion of the floating gate 114 may include a device section 114a having a width $W_{FG1}$. The device section 114a may be arranged over the source region 108 and the drain region 110. For example, the device section 114a may be arranged over the channel region 112 and overlying the source LDD region 108b and the drain LDD region 110b; the source LDD region 108b and the drain LDD region 110b underlying the device section 114a are illustrated by a dash-dot line. In an embodiment of the disclosure, the device section 114a may be arranged substantially perpendicular to the channel region 112, in a lengthwise direction. As used herein, the term "lengthwise direction" is a direction along which a feature, such as the device section 114a, extends the most.

The device portion of the floating gate 114 may further include a connecting section 114b from which the device section 114a extends, i.e., the connecting section 114b may be arranged substantially perpendicular to and at an end portion of the device section 114a. The connecting section 114b may be arranged between the device section 114a and the coupling portion of the floating gate 114.

The coupling portion of the floating gate 114 may include at least two coupling sections, for example, a coupling section 114c and a coupling section 114d. The coupling section 114c and the coupling section 114d may be arranged substantially parallel to the device section 114a, and each coupling section 114c, 114d may have a width $W_{FG2}$; the width $W_{FG2}$ being narrower than the width $W_{FG1}$. In an embodiment of the disclosure, the width $W_{FG2}$ may be at most half the width $W_{FG1}$ of the device section 114a.

The coupling portion of the floating gate 114 may further include a coupling section 114e interconnecting the coupling section 114c and the coupling section 114d, i.e., the coupling section 114e may be arranged substantially perpendicular to and at end portions of the coupling section 114c and the coupling section 114d, and the coupling section 114c and the coupling section 114d may extend therefrom. The coupling section 114e may have a width substantially equal to the width $W_{FG2}$ of the coupling section 114c and the coupling section 114d. In this embodiment of the disclosure, the floating gate 114 may form an E-shaped profile, and the coupling portion of the floating gate 114 may form a U-shaped profile.

The coupling sections 114c, 114d, 114e of the floating gate 114 may be arranged directly over the drain LDD region 110b, and the width $W_{FG2}$ of the floating gate may be substantially equal to the width $W_{D3}$ of the drain LDD region 110b. The drain diffusion region 110a may be arranged at least partially surrounding the coupling portion of the floating gate 114.

In an embodiment of the disclosure, the device section 114a may have a first overlap area over the device well 104 and the coupling sections 114c, 114d, and 114e may have a second overlap area over the coupling well 106, and the first overlap area is smaller than the second overlap area.

The NVM device 100 may yet further include contacts 116 arranged over the device well 104. For example, the contacts 116 may be arranged over the source diffusion region 108*a* and the drain diffusion region 110*a*. The contacts 116 may serve as terminals such that voltages may be applied thereto to provide program, erase, read functionalities to the NVM device 100.

Figure 1B:
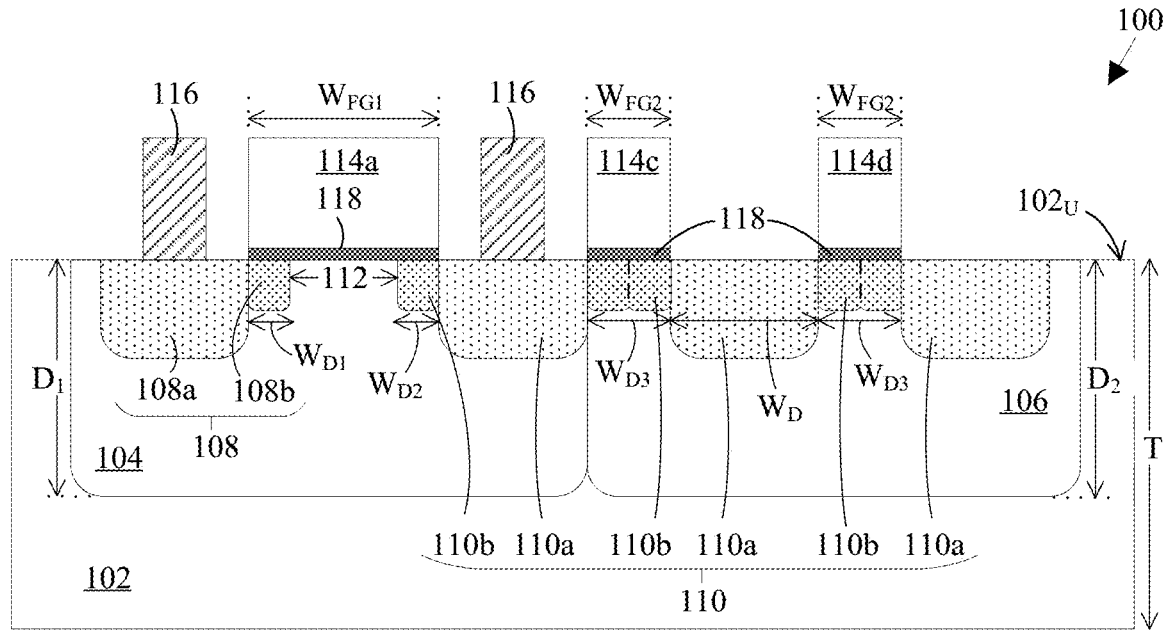
FIG. 1B is a cross-sectional view of the non-volatile memory device in FIG. 1A, taken along a line A-A', according to an embodiment of the disclosure.

FIG. 1B is a cross-sectional view of the NVM device in FIG. 1A, taken along a line A-A', according to an embodiment of the disclosure. The NVM device 100 may include a gate dielectric layer 118 arranged between the floating gate 114 and the active region 102. The gate dielectric layer 118 may serve to electrically isolate the floating gate 114 from the active region 102.

The floating gate 114 may be capacitively coupled to the source region 108 and the drain region 110. As used herein, "capacitively coupled" and "capacitive coupling" indicate the transfer of energy by means of the capacitance between two conductive features, such as between the floating gate 114 and the source region 108, and between the floating gate 114 and the drain region 110. For example, the device section 114*a* of the floating gate 114 may be arranged directly over the source LDD region 108*b* and the drain LDD region 110*b* to provide a first capacitance, and the coupling portion of the floating gate 114 may be arranged directly over the drain LDD region 110*b* to provide a second capacitance.

The second capacitance may be expected to be higher than the first capacitance as the overlap area of the coupling portion of the floating gate 114 and the drain LDD region 110*b* is larger than the overlap area of the device portion of the floating gate 114 and the source LDD region 108*b* and the drain LDD region 110*b* in the device well 104. Accordingly, the coupling portion of the floating gate 114 may boost the overall coupling ratio of the NVM device 100 by providing additional capacitive coupling between the floating gate 114 and drain region 110. The enhanced coupling ratio may induce a higher capacitive voltage to the floating gate 114 to generate a stronger vertical electric field to pull charges from the channel region 112 into the floating gate 114 when a voltage is being applied to the drain region 110 during a program operation.

As mentioned above, the device well 104, the coupling well 106, the source region 108, and the drain region 110 may be arranged in the active region 102. The device well 104 may have a depth $D_1$ from an upper surface $102_U$ of the active region 102, and the coupling well 106 may have a depth $D_2$ from the upper surface $102_U$ of the active region 102. In an embodiment of the disclosure, the depth $D_1$ may be at most as deep as the depth $D_2$. In an embodiment where the coupling well 106 is a native well, the depth $D_2$ of the coupling well 106 may be substantially equal to the thickness T of the active region 102.

Figure 2:
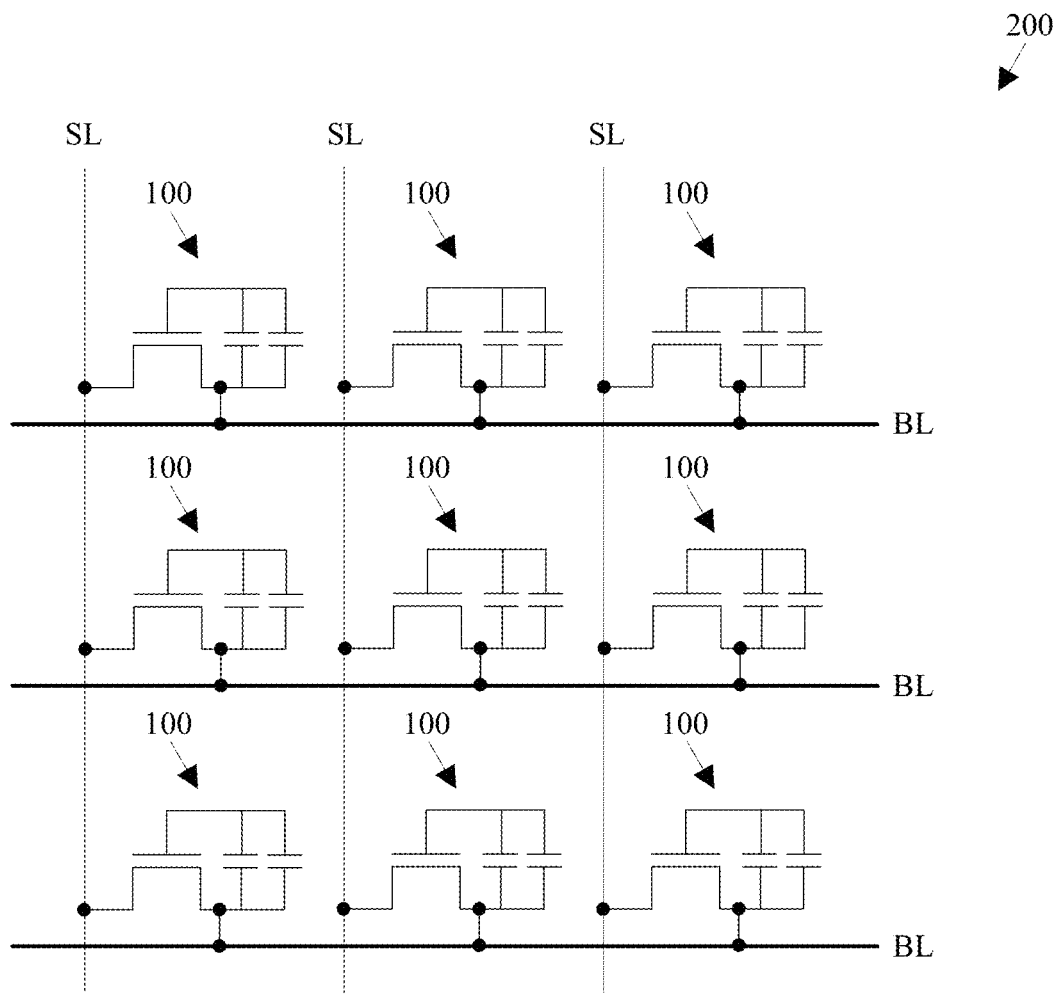
FIG. 2 is a circuit diagram showing an array of non-volatile memory devices of FIGS. 1A and 1B, according to an embodiment of the disclosure.

FIG. 2 is a circuit diagram 200 showing an arrangement configuration of a plurality of NVM devices 100 of FIGS. 1A and 1B, according to an embodiment of the disclosure. The plurality of NVM devices 100 may be arranged in an array configuration of rows and columns in the memory device region of a semiconductor device.

The array includes a plurality of bit lines (BLs) and a plurality of source lines (SLs), and the plurality of BLs may be arranged perpendicular to the plurality of SLs. Each BL and SL may be electrically coupled to an associated NVM device 100, as well as to an addressing/control circuitry (not shown) in order to perform program, erase, and read operations on the associated NVM device 100. The plurality of BLs may be arranged parallel to rows of NVM devices 100 and may be electrically coupled to the corresponding drain regions 110 of each NVM device 100 in an associated row. The SLs may be arranged parallel to columns of NVM devices 100 and may be electrically coupled to the corresponding source regions 108 of each NVM device in an associated column.

The NVM device 100 may be operated by applying appropriate electrical signals thereto. Table 1 below shows a set of exemplary electrical signals that may be applied to the NVM device 100 for a program operation, an erase operation, and a read operation. Each NVM device 100 device may be associated with an SL and a BL. The remaining SLs and BLs that are not associated with the selected NVM device 100 are disconnected (floating) during the program, erase, and read operations directed to the selected NVM device 100. Varying levels of electrical signals may be utilized, depending on the design and technology node of the NVM device 100, without departing from the spirit and scope of the present disclosure.

TABLE 1

| Operation | Bit Line (BL) | Source Line (SL) | Body (Substrate) |
|---|---|---|---|
| Program | 8.5 V | 0~3 V | 0 V |
| Erase | 0 V | 8.5 V | 0 V |
| Read | 2 V | 0 V | 0 V |

To program a selected NVM device 100, a hot carrier injection (HCI) mechanism may be utilized. A voltage of about 8.5 V may be applied to the associated BL, while the associated SL and the body of the NVM device 100 are connected to ground. Alternatively, the associated SL may be biased at a voltage lower than the associated BL but higher than the body, for example, the associated SL may be biased at about 3 V. Charges may be accelerated from the source region 108 towards the drain region 110 through the channel region 112. As the floating gate 114 may be capacitively coupled to the drain region 110, a vertical electric field may be generated by the floating gate 114 through the capacitive coupling to pull or inject the accelerated charges from the channel region 112 thereinto. The need for a separate control gate may be avoided, thus minimizing the size, as well as simplifying the processing steps, of the NVM device 100. The floating gate 114 may become sufficiently negatively charged and the NVM device 100 may be considered to be in a programmed state "0". Other mechanisms to program an NVM device may also be utilized.

In order to improve the program efficiency of the NVM device 100, the strength of the capacitively generated vertical electric field to pull the charges from the channel region 112 into the floating gate 114 needs to be strengthened, and the strengthening may be achieved by enhancing the coupling ratio between the drain region 110 and the floating gate 114. The portion of the floating gate 114 over the coupling well 106 may provide additional capacitive coupling to the drain region 110 to improve the coupling ratio of the NVM device 100. The greater the coupling ratio between the floating gate 114 and the drain region 110, the higher the capacitive voltage induced to the floating gate 114 during a program operation, and the stronger the capacitively generated vertical electric field to pull the charges into the floating gate 114. Accordingly, a high coupling ratio advantageously enables the NVM device 100 to use lower operating voltages while maintaining a comparable device operating speed and program efficiency.

To erase a programmed NVM device 100, a hot holes injection (HHI) mechanism may be utilized. For example, a voltage of about 8.5 V may be applied to the associated SL, while the associated BL and the body of the programmed NVM device 100 are connected to ground. As the floating gate 114 may be capacitively coupled to the source region 108, holes may be generated in the source region 108 and may get pulled, or injected, into the floating gate 114 by the vertical electric field generated by the floating gate 114. The floating gate 114 may be sufficiently discharged of charges and may be considered to be in an erased state "1". Other mechanisms to erase an NVM device may also be utilized.

Figure 3:
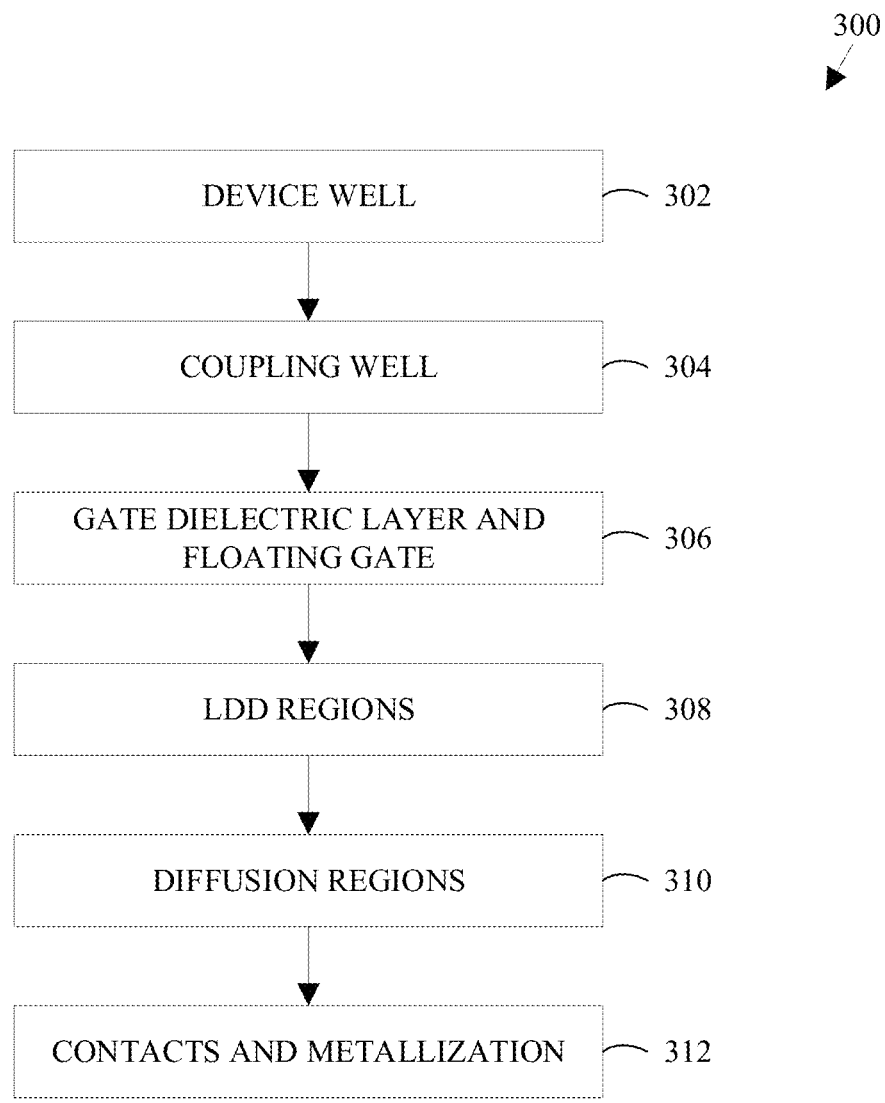
FIG. 3 is a flow chart illustrating a process of forming the non-volatile memory device of FIGS. 1A and 1B, according to an embodiment of the disclosure.

FIG. 3 is a flow chart 300 illustrating a process of forming a similar NVM device as the NVM device 100 of FIGS. 1A and 1B, according to an embodiment of the disclosure. Certain structures may be fabricated, for example, using known processes and techniques, and specifically disclosed processes and methods may be used to achieve individual aspects of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" include deposition of material or photoresist, patterning, exposure, development, etching, cleaning, and/or removal of the material or photoresist as required in forming a described pattern, structure, or opening. Exemplary examples of techniques for patterning include, but not limited to, wet etch photolithographic processes, dry etch photolithographic processes, or direct patterning processes.

A substrate may be provided. An active region may be formed over the substrate by a plurality of deposition or epitaxy techniques; the active region may be synonymous with the active region 102 of the NVM device 100 in FIGS. 1A-1B. A device well may be formed in the active region, as illustrated by operation 302 in the flow chart 300. The device well may be synonymous with the device well 104 of the NVM device 100 in FIGS. 1A-1B. The device well may be formed by introducing dopants into the active region using a doping technique, such as an ion implantation process. In an embodiment of the disclosure, the device well may be doped with P-type dopants.

A coupling well may be formed in the active region, as illustrated by operation 304. The coupling well may be synonymous with the coupling well 106 of the NVM device 100 in FIGS. 1A-1B. The coupling well may be formed in the active region such that the coupling well may be adjacent to the device well. The coupling well may be formed by introducing dopants into the active region using a doping technique, such as an ion implantation process. In an embodiment of the disclosure, the coupling well may be doped with P-type dopants having a lower dopant concentration than the device well. Alternatively, where the coupling well is a native well, no additional doping may be performed adjacent to the device well.

A gate dielectric layer and a floating gate may be formed over the device well and the coupling well, as illustrated by operation 306. The gate dielectric layer and the floating gate may be synonymous with the gate dielectric layer 118 and the floating gate 114 of the NVM device 100 in FIGS. 1A-1B. A layer of gate dielectric material and a layer of conductive material may be deposited over the device well and the coupling well using a deposition technique. The layer of gate dielectric material may include an electrically insulative material, such as a dielectric material with a high dielectric constant; also refer to as a high-k dielectric material or silicon dioxide. The layer of conductive material may include polysilicon or amorphous silicon.

The layer of gate dielectric material and a layer of conductive material may be patterned using a patterning technique to form the gate dielectric layer and the floating gate, respectively. The floating gate may include a device portion over the device well and a coupling portion over the coupling well. The device portion of the floating gate may include a device section and a connecting section and the coupling portion may include at least two coupling sections. The device section, the connecting section, and the coupling sections may be synonymous with the device section 114*a*, the connecting section 114*b*, and the coupling sections 114*c*, 114*d*, and 114*e* of the NVM device 100 in FIGS. 1A-1B. Each of the coupling sections may have a width at most half the width of the device section.

The floating gate may be an integral conductive structure formed from a single layer of conductive material. As such, when the floating gate is programmed, the device portion of the floating gate over the device well and the coupling portion of the floating gate over the coupling well may receive the same program voltage. Similarly, when the floating gate is erased, the device portion of the floating gate over the device well and the coupling portion of the floating gate over the coupling well may receive the same erase voltage.

A plurality of LDD regions may be formed in the active region at least partially under the floating gate, as illustrated by operation 308. The plurality of LDD regions may include a source LDD region and a drain LDD region in the device well, and an additional drain LDD region in the coupling well. The source LDD region and the drain LDD regions may be synonymous with the source LDD region 108*b* and the drain LDD region 110*b* of the NVM device 100 in FIGS. 1A-1B. The plurality of LDD regions may be formed by introducing dopants into the active region using a doping technique, such as an ion implantation process. In an embodiment of the disclosure, the plurality of LDD regions may be doped with N-type dopants having a higher dopant concentration than the device well.

The drain LDD region in the coupling well may include a first portion and a second portion formed at laterally opposite sides of the coupling portion of the floating gate. As the width of the coupling sections of the floating gate may be narrower than the width of the device section, the first portion and the second portion of the drain LDD region may extend and merge, i.e., extend entirely, under the coupling sections to form the drain LDD region. Interfaces where the first portion and the second portion of the drain LDD region merge are illustrated with dashed lines in FIGS. 1A-1B.

Furthermore, since the coupling well has a lower P-type dopant concentration than the device well, the lower P-type dopant concentration aids the formation and merging of the drain LDD region therein. For example, there may be less counter-doping required to form the N-type doped drain LDD region in the coupling well and the N-type doped source LDD region and the drain LDD region in the device well.

A plurality of diffusion regions may be formed adjacent to the floating gate, as illustrated by operation 312. The plurality of diffusion regions may include a source diffusion region and a drain diffusion region, which may be synonymous with the source diffusion region 108*a* and the drain diffusion region 110*a* of the NVM device 100 in FIGS. 1A-1B. The plurality of diffusion regions may be formed by introducing dopants into the active region using a doping technique, such as an ion implantation process. In an embodiment of the disclosure, the plurality of diffusion regions may be doped with N-type dopants having a higher dopant concentration than the plurality of LDD regions.

Contacts and metallization, including interlayer dielectrics, via interconnections, and passivation layers may be formed accordingly to known techniques, as illustrated by operation 314. Contacts may be synonymous with the contacts 116 of the NVM device 100 in FIGS. 1A-1B.

FIGS. 4-9 illustrate various embodiments of NVM devices providing varying degrees of overlap area between a floating gate and a coupling drain region to boost the coupling ratio of the NVM devices.

Figure 4:
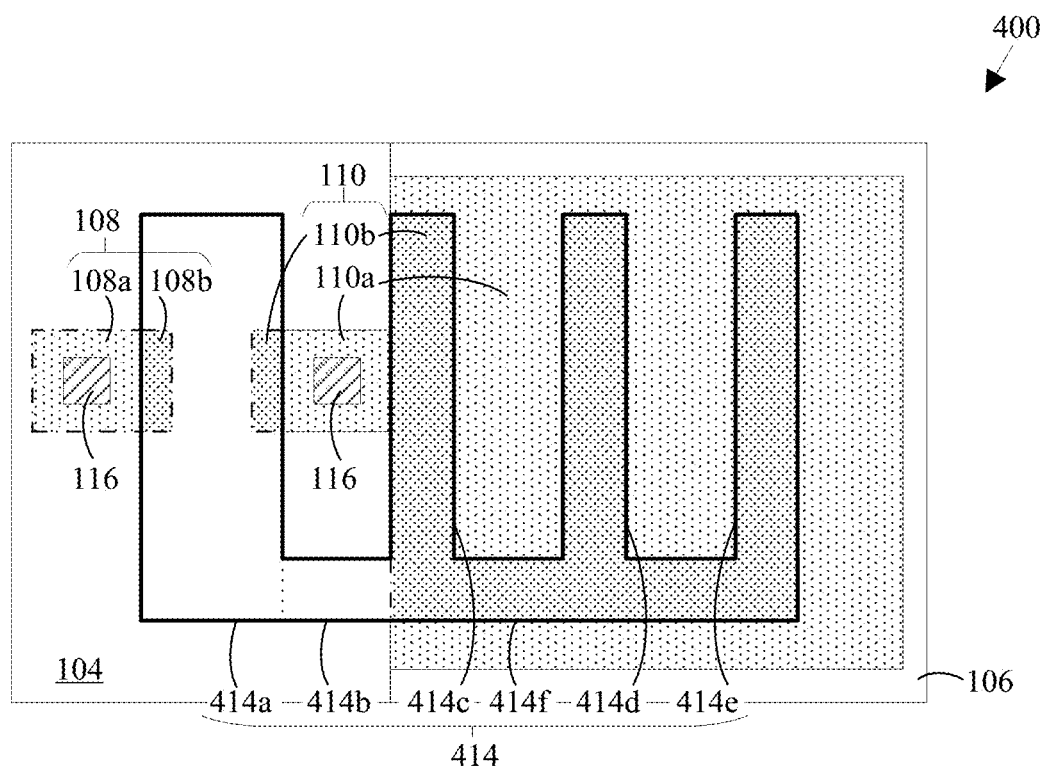
FIGS. 4-9 are plan views of various non-volatile memory devices, according to different embodiments of the disclosure.

FIG. 4 is a plan view of an NVM device 400, according to an embodiment of the disclosure. The NVM device 400 may be similar to the NVM device 100 in FIG. 1A, and thus common features are labeled with the same reference numerals and need not be discussed.

Similar to the NVM device 100, the NVM device 400 may include a floating gate 414 having a device portion over the device well 104 and a coupling portion over the coupling well 106 of the NVM device 400. The device portion of the floating gate 414 may include a device section 414a and a connecting section 414b over the device well 104.

However, unlike the NVM device 100, the coupling portion of the floating gate 414 may include more than three interconnecting coupling sections over the coupling well 106. For example, the coupling portion of the floating gate 414 may include a coupling section 414c, a coupling section 414d, and a coupling section 414e extending from a coupling section 414f. The coupling section 414c, the coupling section 414d, and the coupling section 414e may be arranged substantially parallel to the device section 414a, and may be evenly spaced apart from each other. The coupling section 414f may be arranged substantially perpendicular to and at end portions of the coupling section 414c, the coupling section 414d, and the coupling section 414e.

Figure 5:
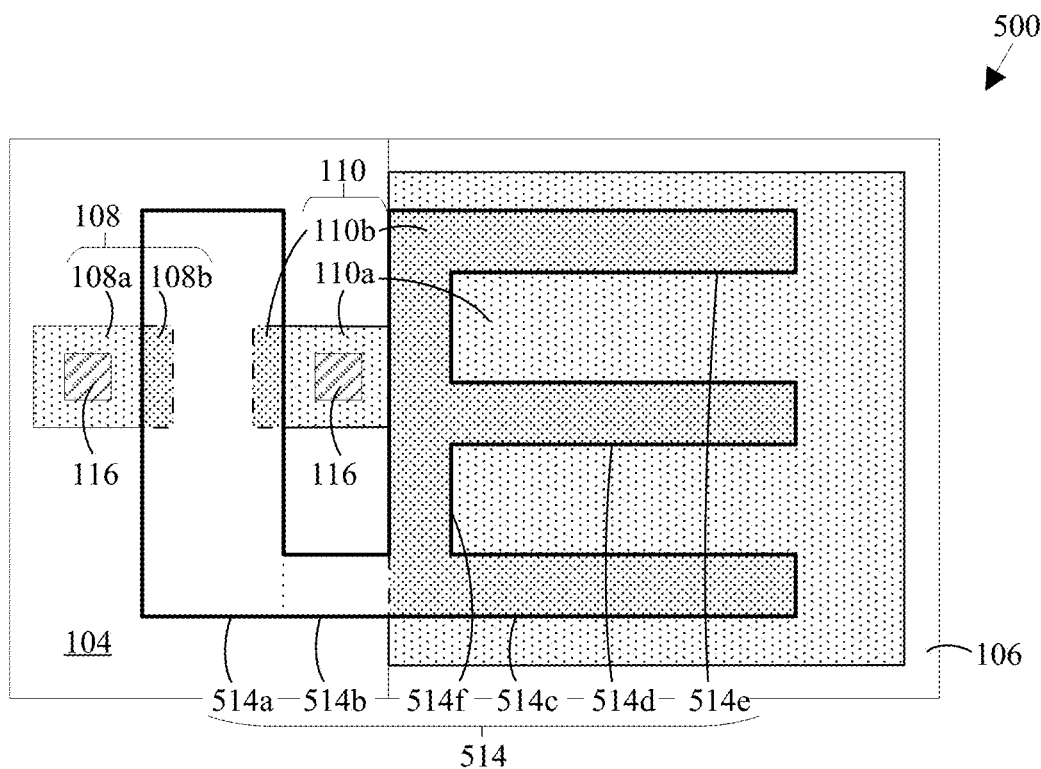

FIG. 5 is a plan view of an NVM device 500, according to another embodiment of the disclosure. The NVM device 500 may be similar to the NVM device 400 in FIG. 4, and thus common features are labeled with the same reference numerals and need not be discussed.

Similar to the NVM device 400, the NVM device 500 may include a floating gate 514 having a device portion over the device well 104 and a coupling portion over the coupling well 106. The device portion of the floating gate 514 may include a device section 514a and a connecting section 514b over the device well 104.

The coupling portion of the floating gate 514 may include a plurality of interconnecting coupling sections arranged substantially perpendicular to the device section 514a, such as a coupling section 514c, a coupling section 514d, and a coupling section 514e extending from a coupling section 514f. The coupling section 514c, the coupling section 514d, and the coupling section 514e may be evenly spaced apart from each other. The coupling section 514f may be arranged substantially perpendicular to and at end portions of the coupling section 514c, the coupling section 514d, and the coupling section 514e, i.e., the coupling section 514f may be arranged substantially parallel to the device section 514a.

Figure 6:
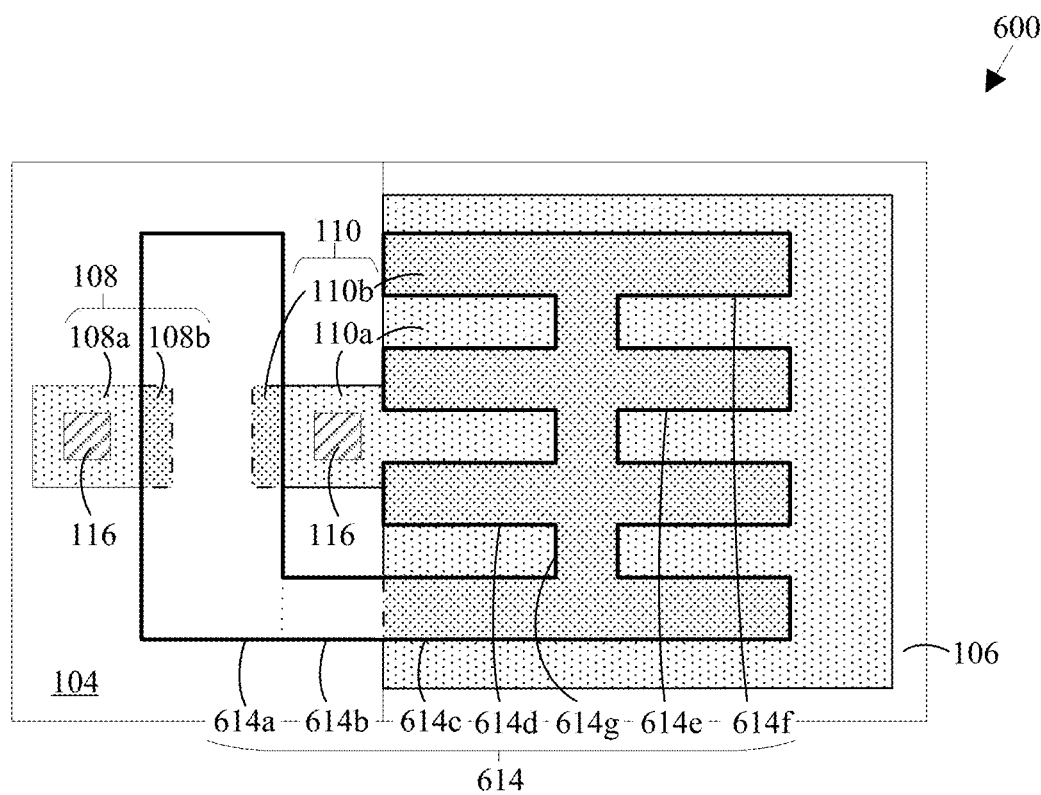

FIG. 6 is a plan view of an NVM device 600, according to another embodiment of the disclosure. The NVM device 600 may be similar to the NVM device 500 in FIG. 5, and thus common features are labeled with the same reference numerals and need not be discussed.

Similar to the NVM device 500, the NVM device 600 may include a floating gate 614 having a device portion over the device well 104 and a coupling portion over the coupling well 106. The device portion of the floating gate 614 may include a device section 614a and a connecting section 614b over the device well 104.

The coupling portion of the floating gate 614 may include a plurality of interconnecting coupling sections arranged substantially perpendicular to the device section 614a, such as a coupling section 614c, a coupling section 614d, a coupling section 614e, and a coupling section 614f evenly spaced apart from each other. A coupling section 614g may be arranged substantially perpendicular to and at middle portions of the coupling section 614c, the coupling section 614d, the coupling section 614e, and the coupling section 614f, i.e., the coupling section 614c, the coupling section 614d, the coupling section 614e, and the coupling section 614f may evenly extend outward from laterally opposite sides of the coupling section 614g.

Figure 7:
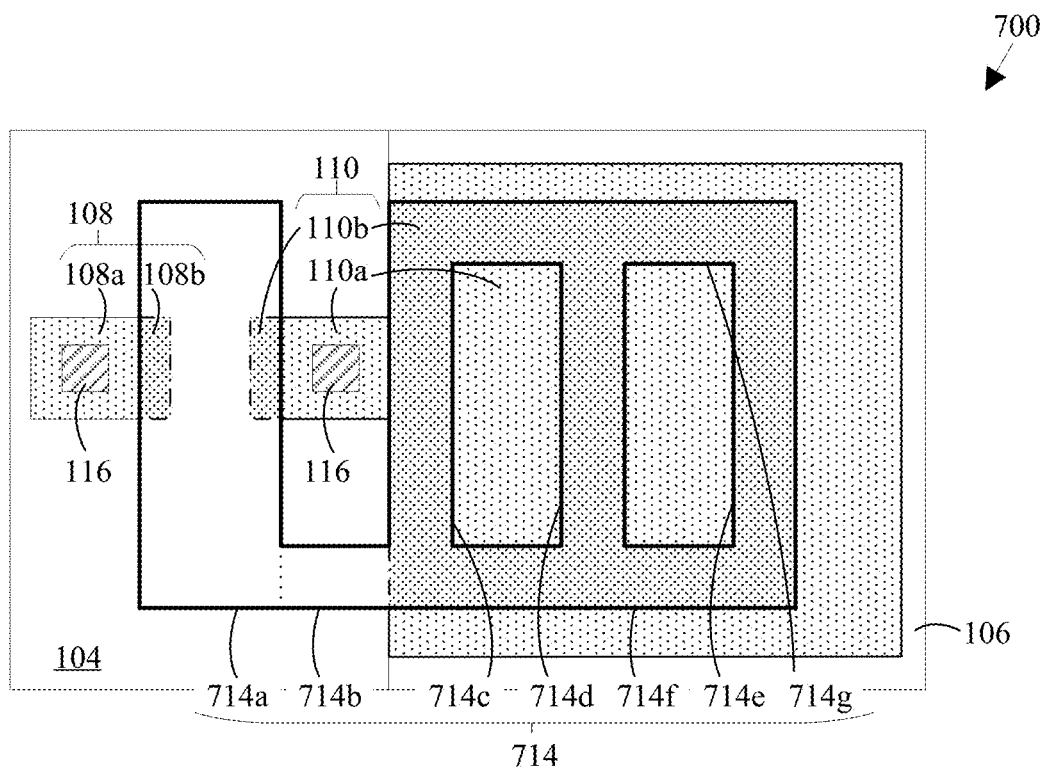

FIG. 7 is a plan view of an NVM device 700, according to another embodiment of the disclosure. The NVM device 700 may be similar to the NVM device 100 in FIG. 1A, and thus common features are labeled with the same reference numerals and need not be discussed.

Similar to the NVM device 100, the NVM device 700 may include a floating gate 714 having a device portion over the device well 104 and a coupling portion over the coupling well 106. The device portion of the floating gate 714 may include a device section 714a and a connecting section 714b over the device well 104.

The coupling portion of the floating gate 714 may include a network of coupling sections, such as a coupling section 714c, a coupling section 714d, a coupling section 714e, coupling section 714f, and a coupling section 714g. As used herein, the term "network" refers to a plurality of interconnecting elements, and each element is connected to at least two other elements. For example, the coupling section 714c may be connected to the coupling section 714f and the coupling section 714g. In another example, the coupling section 714f may be connected to the coupling section 714c, the coupling section 714d, and the coupling section 714f.

In an embodiment of the disclosure, the coupling section 714c, the coupling section 714d, and the coupling section 714e may be arranged substantially parallel to the device section 714a, and the coupling section 714f and the coupling section 714g may be arranged substantially perpendicular to the device section 714a. The coupling section 714f and the coupling section 714g may be further arranged at end portions of the coupling section 714c, the coupling section 714d, and the coupling section 714e.

Figure 8:
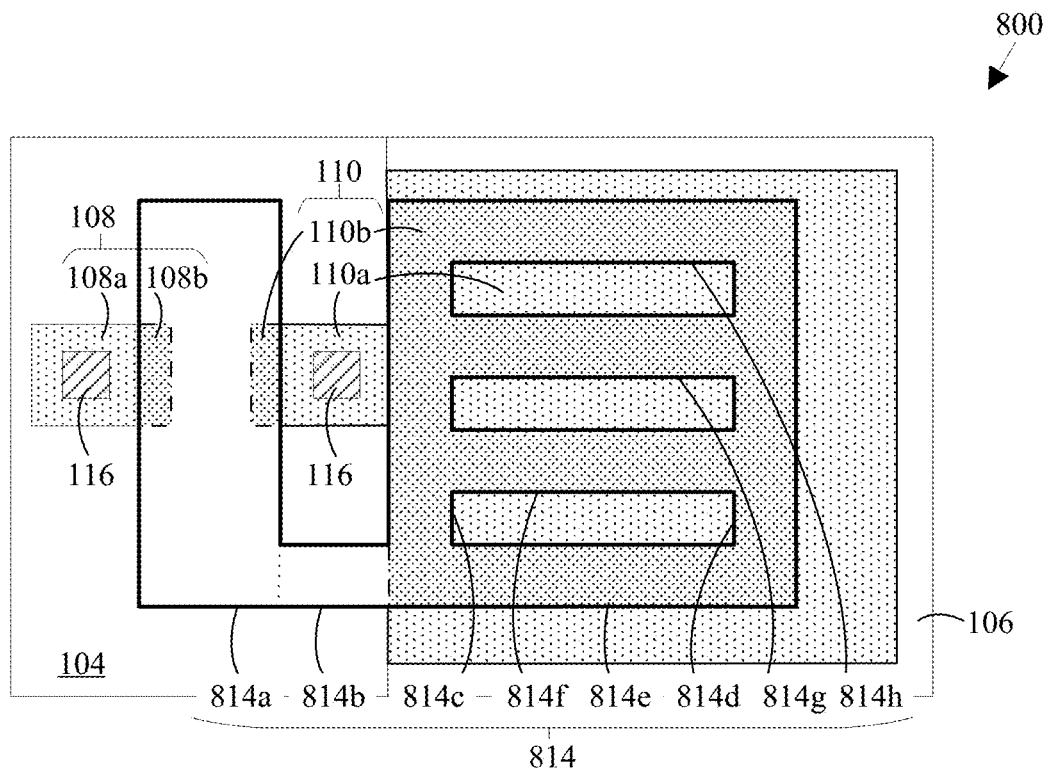

FIG. 8 is a plan view of an NVM device 800, according to another embodiment of the disclosure. The NVM device 800 may be similar to the NVM device 700 in FIG. 7, and thus common features are labeled with the same reference numerals and need not be discussed.

Similar to the NVM device 700, the NVM device 800 may include a floating gate 814 having a device portion over the device well 104 and a coupling portion over the coupling well 106. The device portion of the floating gate 814 may include a device section 814a and a connecting section 814b over the device well 104.

The coupling portion of the floating gate 814 may include a network of coupling sections, such as a coupling section 814c, a coupling section 814d, a coupling section 814e, a coupling section 814f, a coupling section 814g, and a coupling section 814h. For example, the coupling section 814c may be connected to the coupling section 814e, the coupling section 814f, the coupling section 814g, and the coupling section 814h. In another example, the coupling section 814e may be connected to the coupling section 814c and the coupling section 814d.

In an embodiment of the disclosure, the coupling section 814e, the coupling section 814f, the coupling section 814g, and the coupling section 814h may be arranged substantially perpendicular to the device section 814a, and the coupling section 814c and the coupling section 814d may be arranged substantially parallel to the device section 814a. The coupling section 814c and the coupling section 814d may be further arranged at end portions of the coupling section 814e, the coupling section 814f, the coupling section 814g, and the coupling section 814h.

Figure 9:
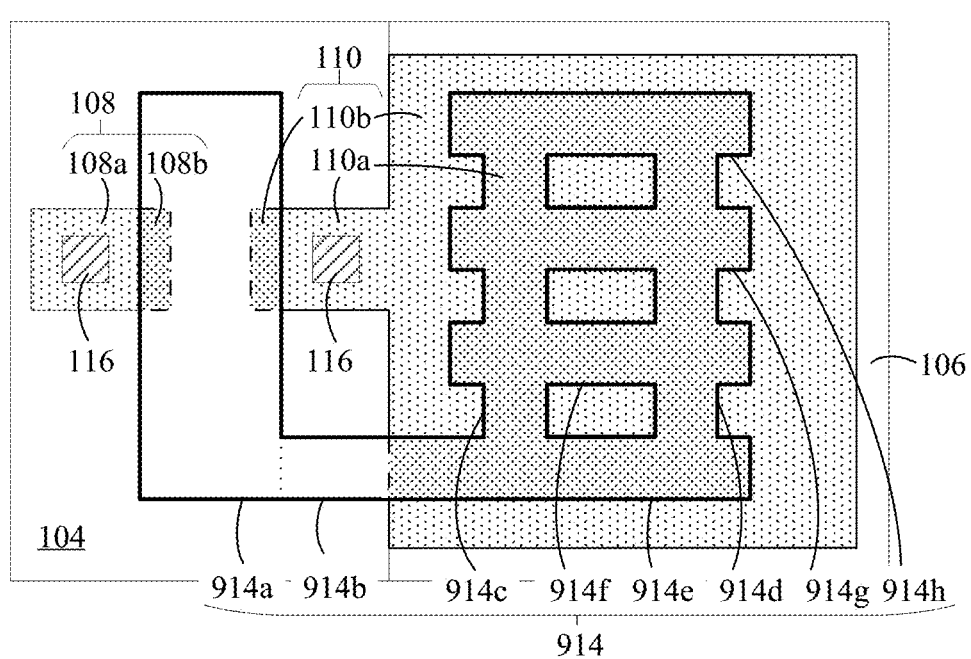

FIG. 9 is a plan view of an NVM device 900, according to another embodiment of the disclosure. The NVM device 900 may be similar to the NVM device 800 in FIG. 8, and thus common features are labeled with the same reference numerals and need not be discussed.

Similar to the NVM device 800, the NVM device 900 may include a floating gate 914 having a device portion over the device well 104 and a coupling portion over the coupling well 106. The device portion of the floating gate 914 may include a device section 914a and a connecting section 914b over the device well 104.

The coupling portion of the floating gate 914 may include a network of coupling sections, such as a coupling section 914c, a coupling section 914d, a coupling section 914e, a coupling section 914f, a coupling section 914g, and a coupling section 914h. For example, the coupling section 914c may be connected to the coupling section 914e, the coupling section 914f, the coupling section 914g, and the coupling section 914h. In another example, the coupling section 914e may be connected to the coupling section 914c and the coupling section 914d.

In an embodiment of the disclosure, the coupling section 914e, the coupling section 914f, the coupling section 914g, and the coupling section 914h may be arranged substantially perpendicular to the device section 914a, and the coupling section 914c and the coupling section 914d may be arranged substantially parallel to the device section 914a. The coupling section 914c and the coupling section 914d may be further arranged proximal to laterally opposite end portions of the coupling section 814e, the coupling section 814f, the coupling section 814g, and the coupling section 814h such that the end portions of the coupling section 914e, the coupling section 914f, the coupling section 914g, and the coupling section 914h extend over the coupling section 914c and the coupling section 914d.

As presented in the above disclosure, various embodiments of NVM devices having asymmetrical floating gates and methods of forming the same are presented. The NVM devices may provide improved device performance with an enhanced coupling ratio.

The NVM device may include a device well and a coupling well adjacent to the device well. The NVM device may further include a source region in the device well and a drain region that extends within the device well and the coupling well. The NVM device may yet further include an asymmetrical floating gate having a device portion over the device well and a coupling portion over the coupling well. The device portion of the floating gate may include a device section over a channel region defined therebetween the source region and the drain region. The coupling portion of the floating gate may include at least two coupling sections over the drain region in the coupling well.

The drain region in the coupling well and the coupling portion of the floating gate over the coupling well may provide additional capacitive coupling to enhance the coupling ratio of the NVM device. The greater the coupling ratio between the floating gate and the drain region, the stronger the capacitively generated vertical electric field by the floating gate to pull the charges into the floating gate during a program operation.

The terms "upper", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A non-volatile memory device, comprising:
a substrate having an active region;
a source region in the active region;
a drain region in the active region and adjacent to the source region, the drain region and the source region define a channel region therebetween;
a floating gate over the active region, the floating gate comprises:
a device section over the channel region;
a plurality of coupling sections entirely over the drain region; and
a connecting section between the device section and the plurality of coupling sections;
a device well in the active region under the device section and the connecting section of the floating gate, wherein the device well has a first dopant concentration; and
a coupling well in the active region and adjacent to the device well under the plurality of coupling sections of the floating gate, wherein the coupling well has a second dopant concentration lower than the first dopant concentration.

2. The non-volatile memory device of claim 1, wherein the device section of the floating gate has a first width and each coupling section of the plurality of coupling sections has a second width, and the first width is wider than the second width.

3. The non-volatile memory device of claim 1, wherein the plurality of coupling sections of the floating gate comprises at least two coupling sections substantially parallel to the device section.

4. The non-volatile memory device of claim 1, wherein the plurality of coupling sections of the floating gate comprises at least two coupling sections substantially perpendicular to the device section.

5. The non-volatile memory device of claim 1, wherein each coupling section of the plurality of coupling sections of the floating gate is connected to at least two other coupling sections of the plurality of coupling sections.

6. The non-volatile memory device of claim 1, wherein the active region has an upper surface, and the device well has a first depth from the upper surface of the active region and the coupling well has a second depth from the upper surface of the active region, and the first depth is at most as deep as the second depth.

7. The non-volatile memory device of claim 1, wherein the plurality of coupling sections of the floating gate comprises at least one coupling section connected to at least two other coupling sections of the plurality of coupling sections.

8. A non-volatile memory device, comprising:
a substrate having an active region;
a device well in the active region;
a coupling well in the active region and adjacent to the device well;
a source region in the device well;
a drain region in the device well and the coupling well, and the drain region and the source region defined a channel region in the device well, wherein the drain region comprises a first drain diffusion region and a first drain lightly-doped diffusion region having a first width adjacent to the first drain diffusion region in the device well, and a second drain diffusion region and a second drain lightly-doped diffusion region adjacent to the second drain diffusion region having a second width in the coupling well, and the second width is wider than the first width; and
a floating gate over the source region and the drain region, the floating gate comprises:
a device section over the channel region;
a plurality of coupling sections entirely over the drain region in the coupling well; and
a connecting section over the device well and between the device section and the plurality of coupling sections.

9. The non-volatile memory device of claim 8, wherein the device section has a first overlap area over the device well and the plurality of coupling sections has a second overlap area over the coupling well, and the first overlap area is smaller than the second overlap area.

10. The non-volatile memory device of claim 8, wherein the second drain lightly-doped diffusion region is under each coupling section of the plurality of coupling sections of the floating gate.

11. The non-volatile memory device of claim 8, wherein the second drain diffusion region in the coupling well is at least partially surrounding the second drain lightly-doped diffusion region.

12. A method of forming a non-volatile memory device, comprising:
forming a device well in an active region of a substrate;
forming a coupling well in the active region of the substrate, wherein the coupling well is adjacent to and has a lower dopant concentration than the device well;
forming a source region and a drain region in the active region of the substrate, and the drain region and the source region define a channel region in the device well; and
forming a floating gate over the active region, the floating gate comprises:
a device section over the channel region;
a plurality of coupling sections entirely over the drain region that is over the coupling well; and
a connecting section between the device section and the plurality of coupling sections, wherein the connecting section and the device section are over the device well.

13. The method of claim 12, further comprises:
forming a device well in the active region, the device section and the connecting section of the floating gate are over the device well; and
forming a coupling well in the active region and adjacent to the device well, the plurality of coupling sections of the floating gate is over the coupling well.

14. The method of claim 13, wherein forming the device well comprises doping the active region with dopants having a first dopant conductivity, and forming the coupling well comprises doping the active region with dopants having the same dopant conductivity as the device well and at a lower dopant concentration than the device well.

15. The method of claim 13, wherein forming the floating gate comprises:
depositing a conductive material over the device well and the coupling well; and
patterning the conductive material to form the device section and the connecting section over the device well and the plurality of coupling sections over the coupling well.

16. The method of claim 15, wherein the patterning of the conductive material comprises forming the device section of the floating gate having a first width and each coupling section of the plurality of coupling sections of the floating gate having a second width, and the second width is narrower than the second width.

17. The method of claim 15, wherein the patterning of the conductive material comprises forming the device section of the floating gate having a first width and each coupling section of the plurality of coupling sections of the floating gate having a second width, and the second width is at least half of the first width.

* * * * *